US012575028B2

(12) United States Patent
Tsubai et al.

(10) Patent No.: US 12,575,028 B2
(45) Date of Patent: Mar. 10, 2026

(54) WIRING CIRCUIT BOARD

(71) Applicant: NITTO DENKO CORPORATION, Osaka (JP)

(72) Inventors: Daigo Tsubai, Osaka (JP); Naoki Shibata, Osaka (JP); Hiroaki Machitani, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 99 days.

(21) Appl. No.: 18/001,681

(22) PCT Filed: May 27, 2021

(86) PCT No.: PCT/JP2021/020193
§ 371 (c)(1),
(2) Date: Dec. 13, 2022

(87) PCT Pub. No.: WO2021/256208
PCT Pub. Date: Dec. 23, 2021

(65) Prior Publication Data
US 2023/0240007 A1 Jul. 27, 2023

(30) Foreign Application Priority Data

Jun. 19, 2020 (JP) ................................. 2020-106312

(51) Int. Cl.
*H05K 1/11* (2006.01)
*H05K 1/05* (2006.01)
*H05K 1/14* (2006.01)
(52) U.S. Cl.
CPC ................. *H05K 1/05* (2013.01); *H05K 1/11* (2013.01)
(58) Field of Classification Search
CPC ............. H01M 50/519; H01M 50/507; H01M 10/425; H01M 10/482; H01M 50/209;
(Continued)

(56) References Cited

U.S. PATENT DOCUMENTS 7,466,519 B2 * 12/2008 Wakaki .................. H05K 3/363
360/245.9
7,675,713 B2 * 3/2010 Ogawa ................. G11B 5/4833
360/245.9
(Continued)

FOREIGN PATENT DOCUMENTS

CN 101578011 A 11/2009
CN 103841772 A 6/2014
(Continued)

OTHER PUBLICATIONS

International Search Report issued in PCT/JP2021/020193 on Aug. 10, 2021.
(Continued)

*Primary Examiner* — Timothy J Thompson
*Assistant Examiner* — Guillermo J Egoavil
(74) *Attorney, Agent, or Firm* — Edwards Neils LLC; Jean C. Edwards, Esq.

(57) ABSTRACT

A wiring circuit board includes a metal support substrate, an insulating layer, and a conductive layer in this order in a thickness direction, and has an edge portion extending in a first direction. The edge portion includes a main structure portion and partially includes a partial structure portion. In the main structure portion, the metal support substrate has a substrate extension portion extending outwardly with respect to the insulating layer in a second direction perpendicular to the first direction and the thickness direction. In the partial structure portion, the insulating layer has an insulating layer extension portion extending outwardly with respect to the metal support substrate in the second direction.

6 Claims, 11 Drawing Sheets

(58) Field of Classification Search
CPC ............. H01M 50/284; H01M 50/503; H01M 50/505; H01M 50/516; H01M 50/522; H01M 50/569; H01M 2220/20; H01M 50/298; H01M 50/50; H01M 50/548; H01M 50/588; H05K 1/118; H05K 2201/10272; H05K 2201/10984; H05K 2201/042; H05K 2201/055; H05K 2201/056; H05K 1/148; H05K 2201/10037; H05K 2201/10189; H05K 1/0281; H05K 2201/2009; H05K 1/05; H05K 1/056; H05K 1/11; H05K 3/242; H05K 3/243; H05K 1/14; H05K 2201/0394; H05K 2201/09181; H05K 2203/167; H05K 3/3442; H05K 3/363; H05K 3/366; Y02E 60/10
USPC ....... 360/244.1, 245.8, 245.9; 174/255, 261; 361/784
See application file for complete search history.

(56) References Cited

U.S. PATENT DOCUMENTS

| | | | | |
|---|---|---|---|---|
| 2006/0118330 A1* | 6/2006 | Ooyabu | ................ | H05K 3/363 |
| 2009/0044969 A1* | 2/2009 | Ishii | ....................... | H05K 3/363 |
| | | | | 174/255 |
| 2009/0277868 A1 | 11/2009 | Ishii et al. | | |
| 2014/0048311 A1 | 2/2014 | Ishii et al. | | |
| 2014/0144680 A1 | 5/2014 | Okuno et al. | | |
| 2015/0382453 A1 | 12/2015 | Okuno et al. | | |
| 2021/0037642 A1 | 2/2021 | Oka et al. | | |
| 2021/0185832 A1 | 6/2021 | Sasaoka et al. | | |
| 2021/0212208 A1 | 7/2021 | Shibata et al. | | |

FOREIGN PATENT DOCUMENTS

| | | | |
|---|---|---|---|
| CN | 111034371 | A | 4/2020 |
| JP | S62-274691 | A | 11/1987 |
| JP | 2002-020898 | A | 1/2002 |
| JP | 2005-135981 | A | 5/2005 |
| JP | 2014-038681 | A | 2/2014 |
| JP | 2021-034481 | A | 3/2021 |
| TW | 202005493 | A | 1/2020 |
| TW | 202010372 | A | 3/2020 |

OTHER PUBLICATIONS

Written Opinion issued in PCT/JP2021/020193 on Aug. 10, 2021.
International Preliminary Report on Patentability issued by WIPO on Dec. 13, 2022, in connection with International Patent Application No. PCT/JP2021/020193.
Office Action, issued by the Taiwanese Intellectual Property Office on Oct. 7, 2024, in connection with Taiwanese Patent Application No. 110120959.
Office Action, issued by the Korean Intellectual Property Office on Jun. 9, 2025, in connection with Korean Patent Application No. 10-2022-7043614.
Office Action, issued by the State Intellectual Property Office of China on Jul. 8, 2025, in connection with Chinese Patent Application No. 202180043324.1.

* cited by examiner

101

30A     20     10a 10A     10b

102

101

30A

21

22(22c)

12(12c)

10

102

40     30A     20     X

21

22(22c)

12(12c)

10

WIRING CIRCUIT BOARD

CROSS-REFERENCE TO RELATED APPLICATIONS

The present application is a 35 U.S.C. 371 National Stage Entry of for PCT/JP2021/020193, filed on May 27, 2021, which claims priority from Japanese Patent Application No. 2020-106312, filed on Jun. 19, 2020, the contents of all of which are herein incorporated by reference in their entirety.

TECHNICAL FIELD

The present invention relates to a wiring circuit board.

BACKGROUND ART

A wiring circuit board having a metal support substrate as a support substrate has been known. For example, a suspension board with a circuit which is assembled into a hard disk drive or the like has been known. The wiring circuit board having a metal support substrate has an insulating layer on the metal support substrate, and has a conductive layer having a predetermined pattern on the insulating layer. The conductive layer includes, for example, a ground pattern (electrically connected to the metal support substrate through a via penetrating the insulating layer in a thickness direction thereof), and a wiring pattern (not electrically connected to the metal support substrate in the wiring circuit board as a final product). The wiring pattern includes a plurality of wirings having a terminal portion at its end portion. The plurality of terminal portions forming one end in the plurality of wirings are, for example, disposed along one edge portion, extending in a predetermined direction, of the insulating layer on the metal support substrate.

In a production step of such a wiring circuit board, for example, the insulating layer is formed on the metal support substrate, and the above-described conductive layer is formed on the insulating layer. In a conductive layer forming step, a lead wire for an electroless plating process is also formed at the same time as the formation of each wiring on the insulating layer (metal support substrate has a portion extending outwardly with respect to the above-described one edge portion of the insulating layer thereon). The lead wire for an electroless plating process extends from the above-described terminal portion of the wiring over the above-described one edge portion of the insulating layer to reach the metal support substrate. Then, a coated film such as tin coated film and nickel coated film is formed on the surfaces of the wiring pattern and the ground pattern by the electroless plating process on the surfaces. In the electroless plating process, since each wiring is electrically connected to the metal support substrate through the lead wire, surface potentials of the wiring pattern and the ground pattern are equal, and uniform coated films are formed on both pattern surfaces. After the electroless plating process, each lead wire is cut, for example, by partial etching removal for electrical separation of the wiring from the metal support substrate (lead wire cutting step).

The art relating to the wiring circuit board and a method for producing a wiring circuit board described above is, for example, described in Patent Document 1 below.

CITATION LIST

Patent Document

Patent Document 1: Japanese Unexamined Patent Publication No. 2002-20898

SUMMARY OF THE INVENTION

Problem to be Solved by the Invention

However, conventionally, there has been a case where the cutting of the lead wire in the lead wire cutting step is insufficient. Specifically, even after an etching process is applied to a predetermined site of each lead wire which extends from the terminal portion on the insulating layer and extends over on the insulating layer, on the end surface (side surface) of the above-described one edge portion of the insulating layer, and on the portion extending outwardly with respect to the one edge portion in the metal support substrate (substrate extension portion), a residue of a material constituting the lead wire may present at the site. In this case, there is a problem that a wiring circuit board including a wiring having a short circuit between the wiring and the metal support substrate is produced.

As a method for avoiding such a problem, it is considered that the substrate extension portion of the metal support substrate and its vicinity are removed by etching along the entire of one edge portion, extending in the above-described predetermined direction, of the insulating layer so that the end surface of the metal support substrate is significantly retracted inwardly with respect to the end surface of the one edge portion of the insulating layer. By such removal of the end portion of the metal support substrate, the one edge portion of the insulating layer extends outwardly with respect to the metal support substrate over the above-described entire region in the predetermined direction, and electrical separation of the wiring from the metal support substrate is ensured. However, a new problem occurs such that the extending one edge portion in the insulating layer is likely to bend. A case where the edge portion of the insulating layer is easily bent is undesirable since it leads to peeling of the insulating layer from the metal support substrate, and a shape failure.

The present invention provides a wiring circuit board including a metal support substrate, an insulating layer, and a conductive layer in this order, the wiring circuit board which is suitable for avoiding a short circuit between the conductive layer and the metal support substrate in a final product and is suitable for suppressing an occurrence of bending in the edge portion of the insulating layer, where the short circuit is due to temporary formation of a lead wire extending from the conductive layer over an edge portion of the insulating layer to reach the metal support substrate.

Means for Solving the Problem

The present invention [1] includes a wiring circuit board including a metal support substrate, an insulating layer, and a conductive layer in this order in a thickness direction, wherein the wiring circuit board has an edge portion extending in a first direction, and wherein the edge portion includes a main structure portion in which the metal support substrate has a substrate extension portion extending outwardly with respect to the insulating layer in a second direction perpendicular to the first direction and the thickness direction, and partially includes a partial structure portion in which the insulating layer has an insulating layer extension portion extending outwardly with respect to the metal support substrate in the second direction.

The present invention [2] includes the wiring circuit board described in the above-described [1], wherein the conductive layer includes a lead wire remaining part-including terminal portion located facing the insulating layer extension portion in the second direction and having a lead wire remaining part protruding toward the insulating layer extension portion.

The present invention [3] includes the wiring circuit board described in the above-described [1] or [2], wherein the conductive layer includes a plurality of terminal portions aligned spaced apart from each other in the first direction, and the plurality of terminal portions include a lead wire remaining part-including terminal portion which is located facing the insulating layer extension portion in the second direction and has a lead wire remaining part protruding toward the insulating layer extension portion.

The present invention [4] includes the wiring circuit board described in any one of the above-described [1] to [3], wherein the main structure portion includes a first main structure portion and a second main structure portion apart in the first direction, and wherein, in the edge portion, the partial structure portion is located between the first main structure portion and the second main structure portion.

The present invention [5] includes the wiring circuit board described in the above-described [4], wherein the edge portion includes a first boundary structure portion in which an end surface of the metal support substrate and an end surface of the insulating layer in the second direction are flush along the thickness direction between the first main structure portion and the partial structure portion and includes a second boundary structure portion in which the end surface of the metal support substrate and the end surface of the insulating layer in the second direction are flush along the thickness direction, between the second main structure portion and the partial structure portion; and wherein each end surface of the substrate extension portions of the first and second main structure portions, each end surface of the metal support substrate and the insulating layer of the first and second boundary structure portions, and an end surface of the insulating layer of the partial structure portion in the second direction are flush along the first direction.

The present invention [6] includes the wiring circuit board described in the above-described [4], wherein each end surface of the insulating layers of the first and second main structure portions and an end surface of the insulating layer extension portion of the partial structure portion in the second direction are flush along the first direction.

The present invention [7] includes the wiring circuit board described in the above-described [4], wherein each end surface of the substrate extension portions of the first and second main structure portions and an end surface of the metal support substrate of the partial structure portion in the second direction are flush along the first direction.

Effect of the Invention

In the wiring circuit board of the present invention, as described above, the edge portion extending in the first direction includes the partial structure portion partially in the first direction, and in the partial structure portion, the insulating layer has the insulating layer extension portion extending outwardly with respect to the metal support substrate in the second direction (perpendicular to the first direction and the thickness direction). Such a partial structure portion is suitable for realizing electrical separation of the wiring from the metal support substrate by, for example, temporarily forming the lead wire which extends from the wiring, included in the conductive layer formed on the insulating layer, over the edge portion of the insulating layer, and to the metal support substrate; and thereafter, by, for example, partially removing the lead wire in the production step of the present wiring circuit board. That is, the present wiring circuit board including the partial structure portion is suitable for avoiding a short circuit between the metal support substrate and the wiring in the final product, where the short circuit is due to temporary formation of the lead wire extending from the wiring, over the edge portion of the insulating layer, and to reach the metal support substrate.

In the present wiring circuit board, as described above, the edge portion extending in the first direction includes the main structure portion in addition to the partial structure portion, and in the main structure portion, the metal support substrate has the substrate extension portion extending outwardly with respect to the insulating layer in the second direction. Such a configuration is suitable for suppressing an occurrence of bending of the edge portion of the insulating layer in the edge portion of the wiring circuit board as compared with a configuration in which the insulating layer extends outwardly with respect to the metal support substrate over, for example, the entire region in the first direction of the edge portion of the wiring circuit board.

BRIEF DESCRIPTION OF THE DRAWINGS

FIG. 6A illustrating a preparing step,

FIG. 6B illustrating a first insulating layer forming step, and

FIG. 6C illustrating a conductive layer forming step.

FIG. 7A illustrating an electroless plating step,

FIG. 7B illustrating a second insulating layer forming step, and

FIG. 7C illustrating an electroless plating film removing step.

FIG. 8A illustrating a resist film forming step,

FIG. 8B illustrating a wet etching step, and

FIG. 8C illustrating a resist film removing step.

DESCRIPTION OF EMBODIMENTS

Figure 1:
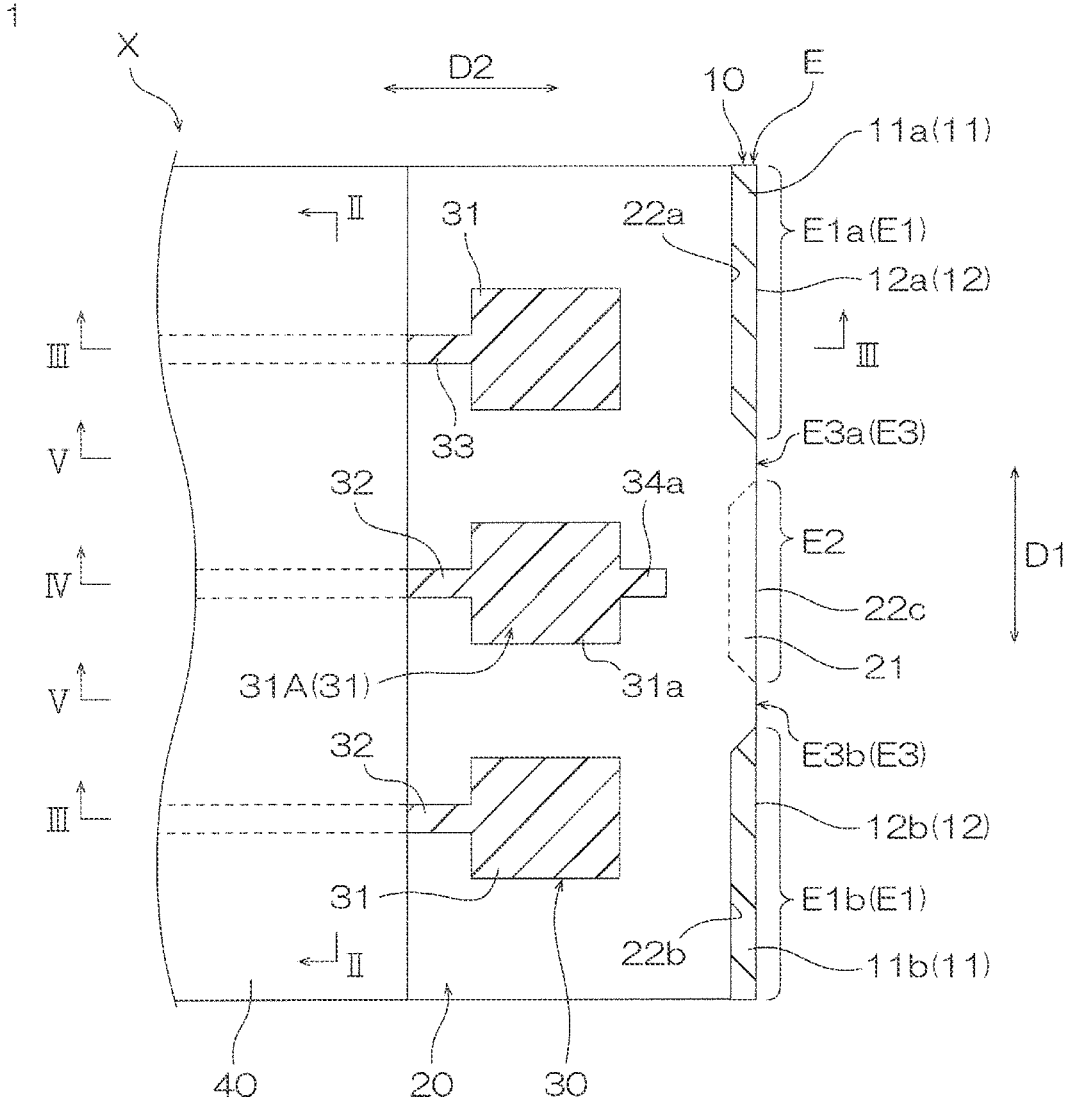
FIG. 1 shows a partially plan view of one embodiment of a wiring circuit board of the present invention.
Figure 2:
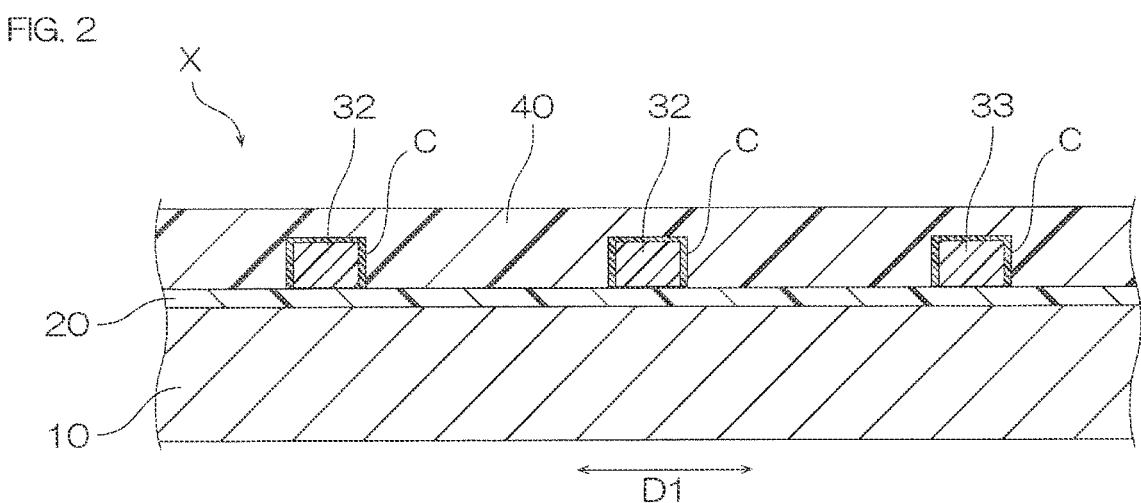
FIG. 2 shows a cross-sectional view along a II-II line shown in FIG. 1.
Figure 3:
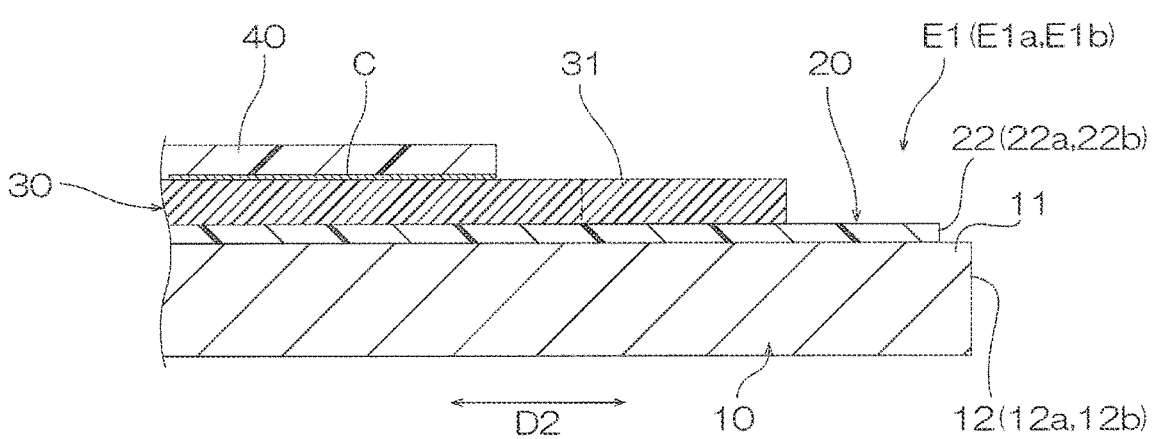
FIG. 3 shows a cross-sectional view along a line shown in FIG. 1.
Figure 4:
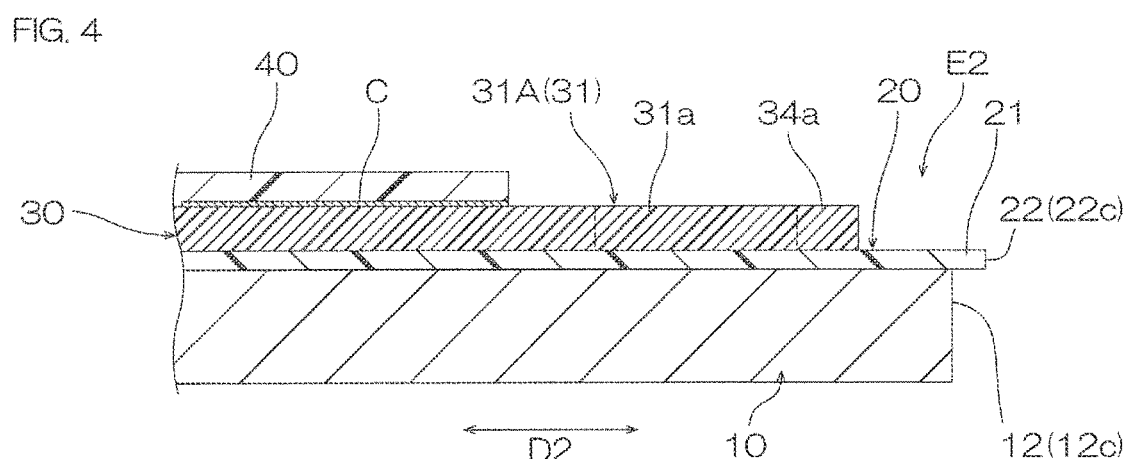
FIG. 4 shows a cross-sectional view along a IV-IV line shown in FIG. 1.
Figure 5:
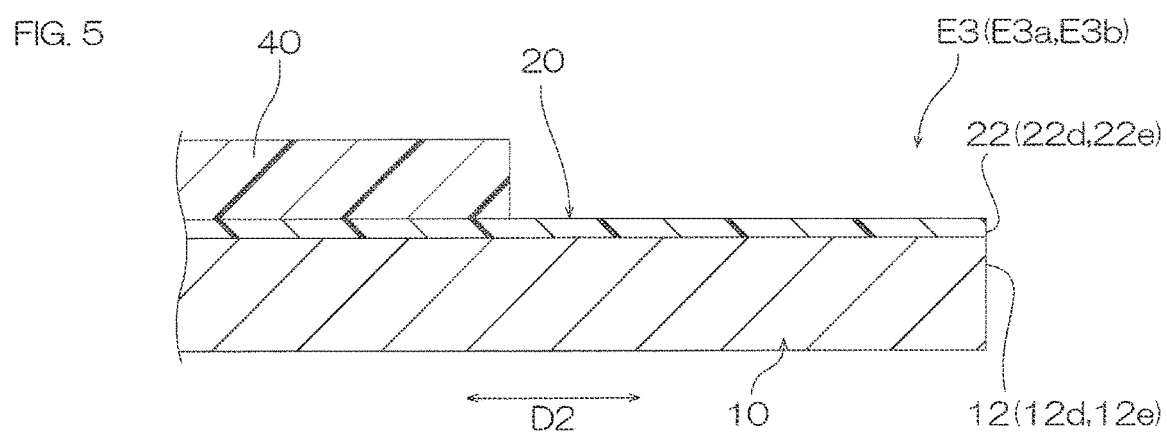
FIG. 5 shows a cross-sectional view along a V-V line shown in FIG. 1.

FIGS. 1 to 5 show a wiring circuit board X which is one embodiment of a wiring circuit board of the present invention. FIG. 1 shows a partially plan view of the wiring circuit board X. FIG. 2 shows a cross-sectional view along a II-II line shown in FIG. 1. FIG. 3 shows a cross-sectional view along a line shown in FIG. 1. FIG. 4 shows a cross-sectional view along a IV-IV line shown in FIG. 1. FIG. 5 shows a cross-sectional view along a V-V line shown in FIG. 1.

As shown in FIGS. 2 to 5, the wiring circuit board X includes a metal support substrate 10, an insulating layer 20 as a base insulating layer, and a conductive layer 30 in this order in a thickness direction, and in the present embodiment, further includes, as a cover insulating layer, an insulating layer 40 covering the conductive layer 30 on the insulating layer 20.

As shown in FIG. 1, the wiring circuit board X has an edge portion E along which a terminal portion row L to be described later is disposed in a part of circuit board's peripheral edge (FIG. 1 shows a plan view of the edge portion E of the wiring circuit board X and its vicinity). The edge portion E extends in one direction so as to define a part of the outer shape of the wiring circuit board X. An extending direction of the edge portion E is defined as a first direction D1. The wiring circuit board X preferably has the plurality of edge portions E. Further, the wiring circuit board X may have a predetermined number of edge portions E continuously in the first direction D1.

The metal support substrate 10 is an element for ensuring the mechanical strength of the wiring circuit board X. In the present embodiment, the metal support substrate 10 has a predetermined shape when viewed from the top.

Examples of a material for the metal support substrate 10 include metal foils. Examples of a metal material for the metal foil include copper, copper alloy, stainless steel, and 42-alloy. An example of the stainless steel includes SUS304 based on standards of AISI (American Iron and Steel Institute).

A thickness of the metal support substrate 10 is, for example, 10 μm or more, preferably 15 μm or more, more preferably 50 μm or more, and for example, 500 μm or less, preferably 300 μm or less.

The insulating layer 20 is, as shown in FIGS. 2 to 5, located on one side in the thickness direction of the metal support substrate 10. In the present embodiment, the insulating layer 20 is located on one surface in the thickness direction of the metal support substrate 10.

Examples of the material for the insulating layer 20 include resin materials such as polyimide, polyether nitrile, polyether sulfone, polyethylene terephthalate, polyethylene naphthalate, and polyvinyl chloride (examples of the material for the insulating layer 40 to be described later include the same resin materials).

The thickness of the insulating layer 20 is, for example, 1 μm or more, preferably 3 μm or more, and for example, 35 μm or less, preferably 15 μm or less.

As shown in FIG. 1, the edge portion E includes a main structure portion E1 and partially includes a partial structure portion E2. Specifically, in the present embodiment, the edge portion E includes the main structure portion E1, the partial structure portion E2, and a boundary structure portion E3. The main structure portion E1 includes a first main structure portion E1*a* and a second main structure portion E1*b* apart in the first direction D1. The partial structure portion E2 is located between the first main structure portion E1*a* and the second main structure portion E1*b* in the first direction D1. The boundary structure portion E3 includes a first boundary structure portion E3*a* and a second boundary structure portion E3*b*. The first boundary structure portion E3*a* is located between the first main structure portion E1*a* and the partial structure portion E2 in the first direction D1. The second boundary structure portion E3*b* is located between the partial structure portion E2 and the second main structure portion E1*b* in the first direction D1.

In the main structure portion E1 (the first main structure portion E1*a* and the second main structure portion E1*b*), as shown in FIG. 3, the metal support substrate 10 has a substrate extension portion 11 (a substrate extension portion 11*a* in the first main structure portion E1*a*, and a substrate extension portion 11*b* in the second main structure portion E1*b*) extending outwardly with respect to the insulating layer 20 in a second direction D2 (direction perpendicular to the first direction D1 and the thickness direction). That is, in the main structure portion E1, an end surface 12 (an end surface 12*a* in the first main structure portion E1*a*, and an end surface 12*b* in the second main structure portion E1*b*) as a substrate side surface provided in the metal support substrate 10 is located outwardly in the second direction D2 with respect to an end surface 22 (an end surface 22*a* in the first main structure portion E1*a*, and an end surface 22*b* in the second main structure portion E1*b*) as a side surface of an insulating layer provided in the insulating layer 20. An extending length of the substrate extension portion 11 in the second direction D2 is, for example, 3 μm or more, preferably 5 μm or more, and for example, 200 μm or less, preferably 100 μm or less (the extending length of the substrate extension portion 11 is the same in modified examples to be described later).

In the partial structure portion E2, as shown in FIG. 4, the insulating layer 20 has an insulating layer extension portion 21 extending outwardly with respect to the metal support substrate 10 in the second direction D2. That is, in the partial structure portion E2, the end surface 22 of the insulating layer 20 (an end surface 22c in the partial structure portion E2) is located outwardly in the second direction D2 with respect to the end surface 12 of the metal support substrate 10 (an end surface 12c in the partial structure portion E2). The extending length of the insulating layer extension portion 21 in the second direction D2 is, for example, 3 μm or more, preferably 5 μm or more, and for example, 200 μm or less, preferably 100 μm or less (the extending length of the insulating layer extension portion 21 is the same in the modified examples to be described later).

In the boundary structure portion E3 (the first boundary structure portion E3a and the second boundary structure portion E3b), as shown in FIG. 5, the end surface 12 of the metal support substrate 10 in the second direction D2 (an end surface 12d in the first boundary structure portion E3a, and an end surface 12e in the second boundary structure portion E3b) and the end surface 22 of the insulating layer 20 (an end surface 22d in the first boundary structure portion E3a, and an end surface 22e in the second boundary structure portion E3b) are flush along the thickness direction. In the present embodiment, each of the first boundary structure portion E3a and the second boundary structure portion E3b having the end surface 12 and the end surface 22 flush along the thickness direction has a form extending in the first direction D1.

Further, in the present embodiment, when viewed from the top shown in FIG. 1, the end surface 12a of the metal support substrate 10 (the substrate extension portion 11a) of the first main structure portion E1a, the end surfaces 12d and 22d of the metal support substrate 10 and the insulating layer 20 in the first boundary structure portion E3a, the end surface 22c of the insulating layer 20 of the partial structure portion E2, the end surfaces 12e and 22e of the metal support substrate 10 and the insulating layer 20 in the second boundary structure portion E3b, and the end surface 12b of the metal support substrate 10 (the substrate extension portion 11b) of the second main structure portion E1b are flush along the first direction D1.

In such a configuration, in the first and second boundary structure portions E3a and E3b, the insulating layer 20 is in contact with the metal support substrate 10 to be directly supported, and both ends in the first direction D1 of the insulating layer extension portion 21 of the partial structure portion E2 are continuous with the insulating layer 20 of the boundary structure portions E3a and E3b. That is, both ends in the first direction D1 of the insulating layer extension portion 21 of the partial structure portion E2 are continuous, in the first direction D1, with the insulating layer 20 which is in contact with the metal support substrate 10 to be directly supported. Therefore, bending of the insulating layer extension portion 21 is suppressed.

In the wiring circuit board X, the first boundary structure portion E3a and the second boundary structure portion E3b having the end surface 12 and the end surface 22 flush along the thickness direction may have a form forming a boundary between the main structure portion E1 and the partial structure portion E2 without having a form extending in the first direction D1.

The conductive layer 30 includes a plurality of terminal portions 31, a plurality of signal wirings 32, and a plurality of ground wirings 33, and is located on one side in the thickness direction of the insulating layer 20. In the present embodiment, the conductive layer 30 is located on one surface in the thickness direction of the insulating layer 20.

The plurality of terminal portions 31 include the plurality of terminal portions 31 forming the terminal portion row L aligned spaced apart in the first direction D1 along the edge portion E (illustratively illustrating a form in which the terminal portion row L includes the three terminal portions 31, and the two signal wirings 32 and the one ground wiring 33 extend from these terminal portions 31). In the terminal portion row L disposed along the edge portion E, a distance between the adjacent terminal portions 31 is, for example, 10 μm or more, and for example, 1000 μm or less.

The plurality of terminal portions 31 included in the terminal portion row L include a lead wire remaining part-including terminal portion 31A. The lead wire remaining part-including terminal portion 31A is located facing the insulating layer extension portion 21 in the second direction D2, and has a terminal portion body 31a and a lead wire remaining part 34a. The terminal portion body 31a has a wider land shape than the signal wiring 32 (the terminal portion 31 other than the terminal portion 31A itself has a wider land shape than the signal wiring 32). The lead wire remaining part 34a protrudes from the edge portion E side of the terminal portion body 31a in the second direction D2 toward the edge portion E. The lead wire remaining part 34a is a part of a lead wire 34 (lead wire for electroless plating process) which is temporarily formed in a production step to be described later of the wiring circuit board X. A protruding length of the lead wire remaining part 34a is, for example, 5 μm or more, and for example, 1000 μm or less.

Each signal wiring 32 has a predetermined pattern shape on the insulating layer 20. One end of the signal wiring 32 shown in the partially plan view of FIG. 1 is connected to the terminal portion 31 included in the terminal portion row L (in FIG. 1, a portion covered with the insulating layer 40 to be described later in the signal wiring 32 is shown by a broken line). The other end of the signal wiring 32 is connected to one of the unillustrated terminal portions 31 (the first terminal portion 31a) which is not included in the terminal portion row L.

The thickness of the signal wiring 32 is, for example, 3 μm or more, preferably 5 μm or more, and for example, 50 μm or less, preferably 30 μm or less. A width of the signal wiring 32 (dimension in a direction perpendicular to the extending direction of the signal wiring 32) is, for example, 5 μm or more, preferably 8 μm or more, and for example, 100 μm or less, preferably 50 μm or less.

The ground wiring 33 has a predetermined pattern shape on the insulating layer 20. One end of the ground wiring 33 shown in the partially plan view of FIG. 1 is connected to the terminal portion 31 included in the terminal portion row L (in FIG. 1, a portion covered with the insulating layer 40 to be described later in the ground wiring 33 is shown by the broken line). The other end of the ground wiring 33 is connected to one of the unillustrated terminal portions 31 (the second terminal portion 31) which is not included in the terminal portion row L. The terminal portion 31 is electrically connected to the metal support substrate 10 through a via (not shown) penetrating the insulating layer 20 in the thickness direction thereof. The ground wiring 33 is electrically connected to the metal support substrate 10 through the terminal portion 31.

The thickness of the ground wiring 33 is, for example, 3 μm or more, preferably 5 μm or more, and for example, 50 μm or less, preferably 30 μm or less. The width of the ground wiring 33 (dimension in the direction perpendicular to the extending direction of the ground wiring 33) is, for example, 5 μm or more, preferably 8 μm or more, and for example, 100 μm or less, preferably 50 μm or less.

Examples of a material for the conductive layer 30 include conductive materials such as copper, silver, gold, solder, or an alloy of these, and preferably, copper is used.

The signal wiring 32 and the ground wiring 33 in the conducive layer 30 are, as shown in FIGS. 2 to 4, covered with a coated film C, except for mainly the surface in contact with the insulating layer 20. The coated film C is a plating film formed by the electroless plating process to be described later. The coated film C has a function of ensuring adhesion between the conductive layer 30 and the insulating layer 40, and a function of preventing so-called migration in the conductive layer 30. Examples of the material for the coated film C include nickel and tin, and preferably, nickel is used. The thickness of the coated film C is, for example, 0.01 μm or more, and for example, 1 μm or less.

The insulating layer 40 is disposed on one surface in the thickness direction of the insulating layer 20 so as to cover the signal wiring 32 and the ground wiring 33, and has a predetermined pattern shape. The insulating layer 40 does not cover the terminal portion 31, and the terminal portion 31 is exposed.

A height of the insulating layer 40 from the insulating layer 20 (in FIGS. 2 to 4, a distance from the insulating layer 20 to an upper end of the insulating layer 40 in the figure) is, for example, 5 μm or more, preferably 7 μm or more, and for example, 70 μm or less, preferably 50 μm or less as long as it is greater than the total thickness of the conductive layer 30 and the coated film C of the surface thereof.

FIGS. 6A to 8C show one example of a method for producing the wiring circuit board X. FIGS. 6A to 8C show the present production method as a change in a cross section corresponding to FIG. 4.

Figure 6A:
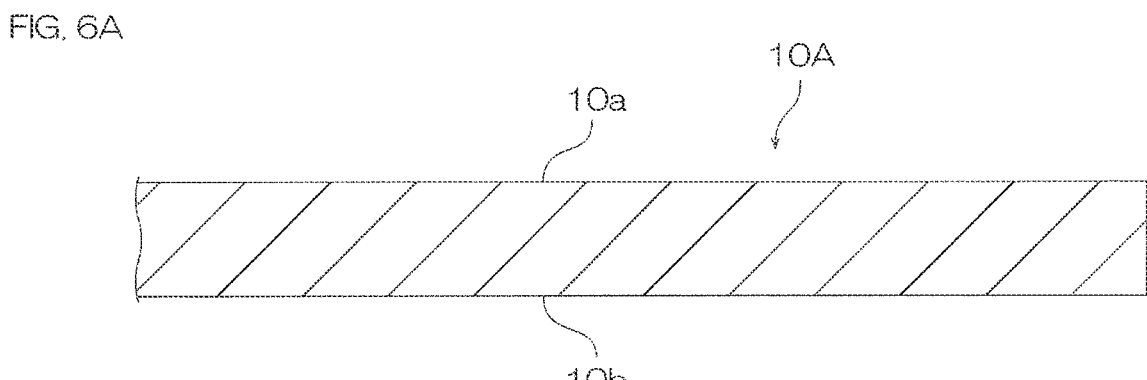
FIGS. 6A to 6C show a part of steps in a method for producing a wiring circuit board shown in FIG. 1 as a change in a cross section corresponding to FIG. 4.

In the present production method, first, as shown in FIG. 6A, a metal substrate 10A is prepared (preparing step). The metal substrate 10A is a substrate which is formed into the metal support substrate 10 by an outer shape processing to be described later, and has a first surface 10a and a second surface 10b at the opposite side thereto.

Figure 6B:
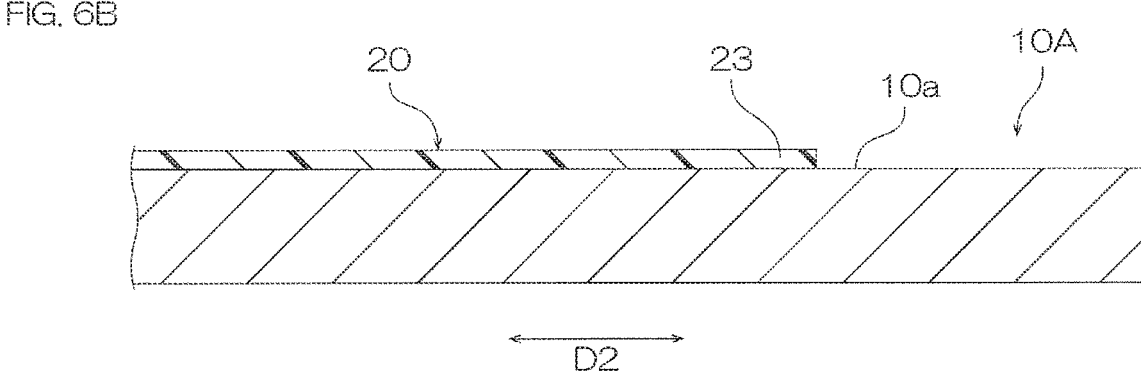
Figure 9:
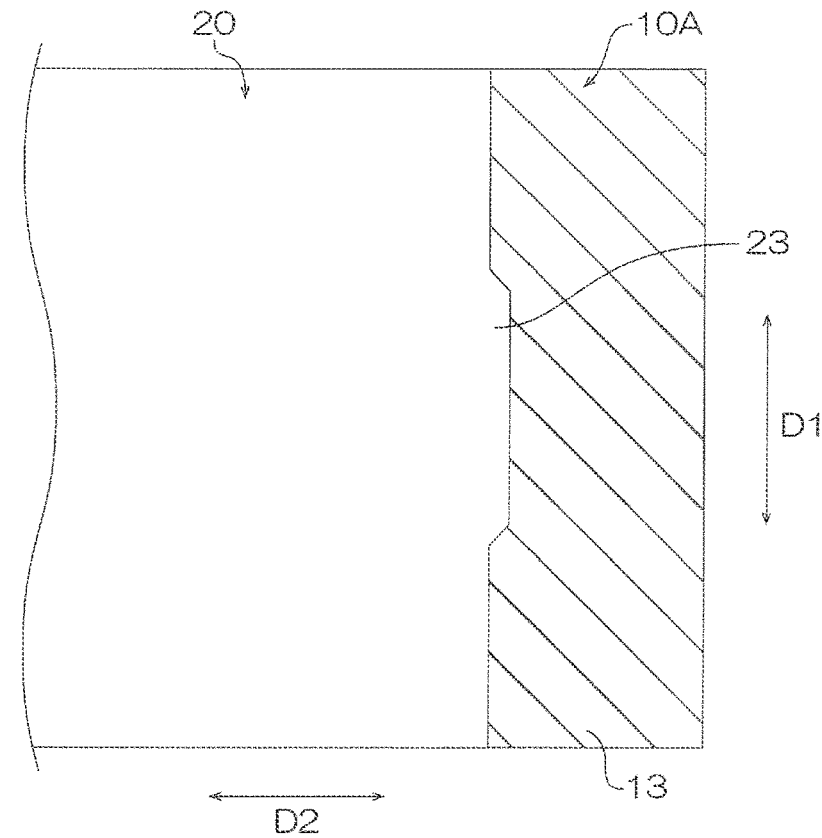
FIG. 9 shows a partially plan view after the first insulating layer forming step shown in FIG. 6B.

Next, as shown in FIGS. 6B and 9, the insulating layer 20 is pattern-formed on the first surface 10a of the metal substrate 10A (first insulating layer forming step). The insulating layer 20 is formed so as to have a protruding portion 23 including a portion serving as the above-described insulating layer extension portion 21 in the wiring circuit board X as a final product. Further, the insulating layer 20 has a via hole (not shown) in which the above-described via is formed at a predetermined site.

In the present step, first, a solution (varnish) of a photosensitive resin is applied onto the first surface 10a of the metal substrate 10A and dried, thereby forming a coating film. Next, the coating film on the metal substrate 10A is subjected to an exposure process through a predetermined mask, a subsequent development process, and thereafter, a bake process as required. In this way, the insulating layer 20 is formed on the metal substrate 10A. In a step after undergoing the present step, as shown in FIG. 9, the metal substrate 10A has a substrate extension portion 13 extending outwardly with respect to the insulating layer 20 in the second direction D2. The substrate extension portion 13 extends outwardly with respect to the insulating layer 20 over the entire region in the first direction D1 at a site to be formed into the edge portion E in the wiring circuit board X.

Figure 6C:
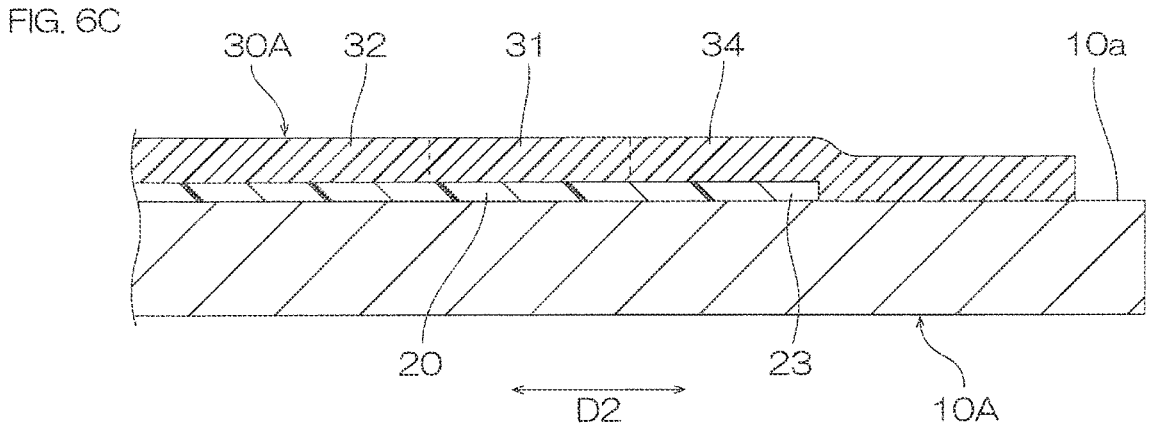
Figure 10:
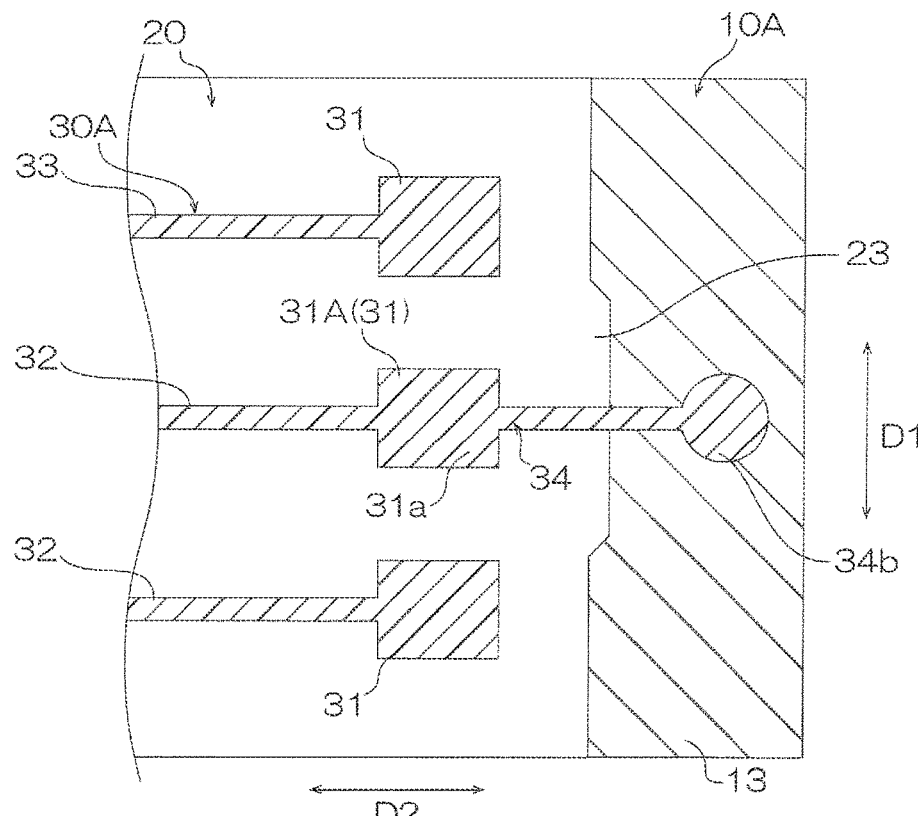
FIG. 10 shows a partially plan view after the conductive layer forming step shown in FIG. 6C.

Next, as shown in FIGS. 6C and 10, a conductive layer 30A is formed on the insulating layer 20 and the metal substrate 10A (conductive layer forming step). The conductive layer 30A includes the lead wire 34 in addition to the terminal portions 31 (including the terminal portion 31a), the signal wiring 32, and the ground wiring 33 described above. The lead wire 34 extends over the insulating layer 20 from the site at the opposite side to a connection site of the signal wiring 32 in the terminal portion 31A over the end portion in the second direction D2 of the protruding portion 23 in the insulating layer 20, and the lead wire 34 reaches to the substrate extension portion 13. In the present embodiment, the lead wire 34 has a pad portion 34b in a circular shape, when viewed from the top, on the metal substrate 10A. The terminal portion 31a and the signal wiring 32 connected thereto are electrically connected to the metal substrate 10A through the lead wire 34. Another signal wiring 32 shown in FIG. 10 is connected to one of the unillustrated terminal portions 31a which is not included in the terminal portion row L (the unillustrated first terminal portion 31a). This terminal portion 31a is electrically connected to the metal substrate 10A through another lead wire 34. The other lead wire 34 preferably extends from the unillustrated terminal portion 31a and extends on the insulating layer 20 over a protruding portion similar to the protruding portion 23 in the insulating layer 20 to reach the substrate extension portion similar to the substrate extension portion 13. Further, the ground wiring 33 is electrically connected to the metal substrate 10A through the above-described second terminal portion 31 and the above-described via.

In the conductive layer forming step, first, a seed layer is formed, for example, by a sputtering method so as to cover the first surface 10a of the metal substrate 10A and the insulating layer 20 thereon. Examples of the material for the seed layer include Cr, Cu, Ni, Ti, and alloys of these. Next, a resist pattern is formed on the seed layer. The resist pattern has an opening portion having a shape corresponding to a pattern shape of the conductive layer 30A. In the formation of the resist pattern, for example, a photosensitive resist film is attached onto the seed layer, thereby forming a resist film. Thereafter, the resist film is subjected to the exposure process through the predetermined mask, the subsequent development process, and thereafter, the bake process as required. Next, a conductive material such as copper is deposited in an opening portion of the resist pattern using a plating solution in an electrolytic plating method. Next, the resist pattern is removed by etching. Next, a portion exposed by the resist pattern removal in the seed layer is removed by the etching. As described above, it is possible to form the conductive layer 30A.

Figure 7A:
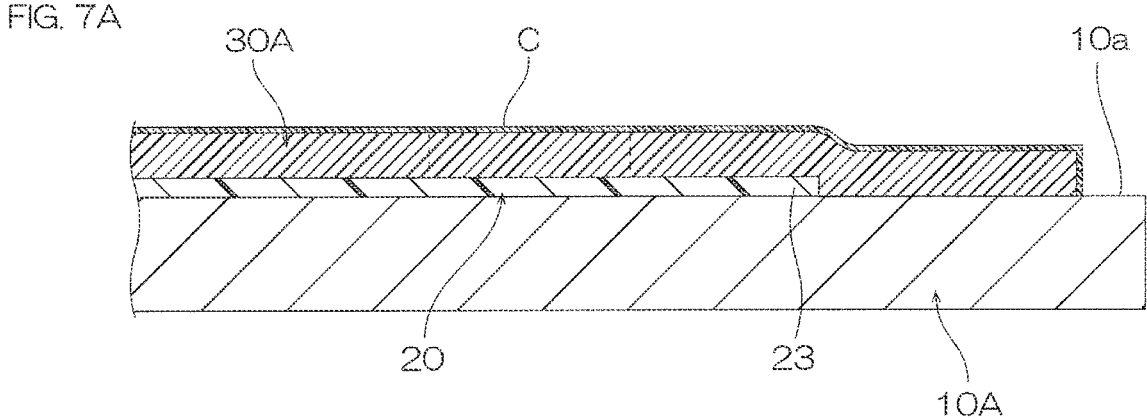
FIGS. 7A to 7C show steps subsequent to the steps shown in FIG. 6.

Next, as shown in FIG. 7A, the coated film C is formed by the electroless plating process (electroless plating step). In the present step, the coated film C (electroless plating film) is formed so as to cover the conductive layer 30A except for the surface in contact with the insulating layer 20 and the metal substrate 10A in the conductive layer 30A using an electroless plating solution in the electroless plating process. The electroless plating solution contains ions of the material for forming the coated film C. Examples of the material for the coated film C include nickel and tin, and preferably, nickel is used.

In the present step, since each signal wiring 32 is electrically connected to the metal substrate 10A through the lead wire 34, surface potentials of each signal wiring 32 and the ground wiring 33 (both electrically connected to the metal support substrate 10 through the via) are equal, and the uniform coated film C is formed on the surfaces of the signal wiring 32 and the ground wiring 33.

Figure 7B:
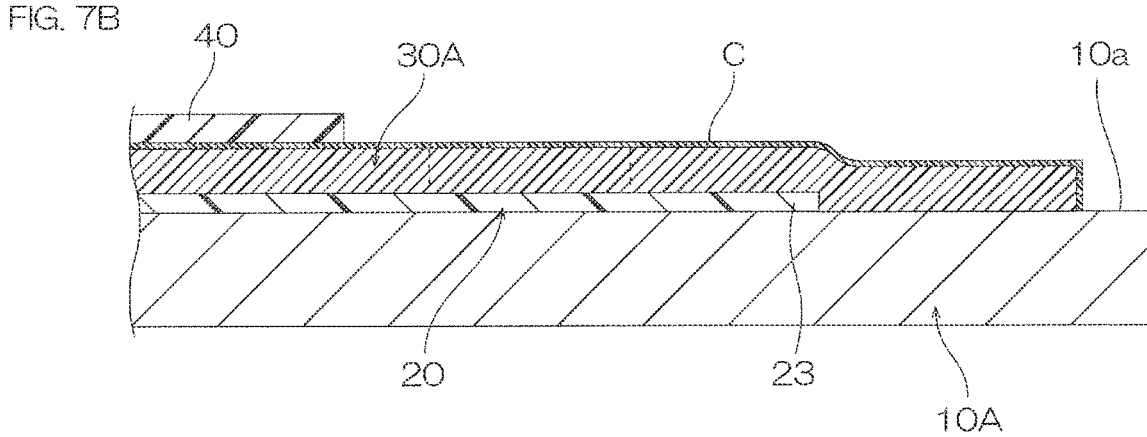

Next, as shown in FIG. 7B, the insulating layer 40 covering a predetermined part of the conductive layer 30A (the signal wiring 32 and the ground wiring 33) is formed on the insulating layer 20 (second insulating layer forming step). In the present step, first, the solution (varnish) of the photosensitive resin is applied onto the side of the first surface 10a of the metal substrate 10A and dried, thereby forming a coating film. Next, the coating film is subjected to the exposure process through the predetermined mask, the subsequent development process, and thereafter, the bake process as required. In this way, it is possible to form the insulating layer 40.

Figure 7C:
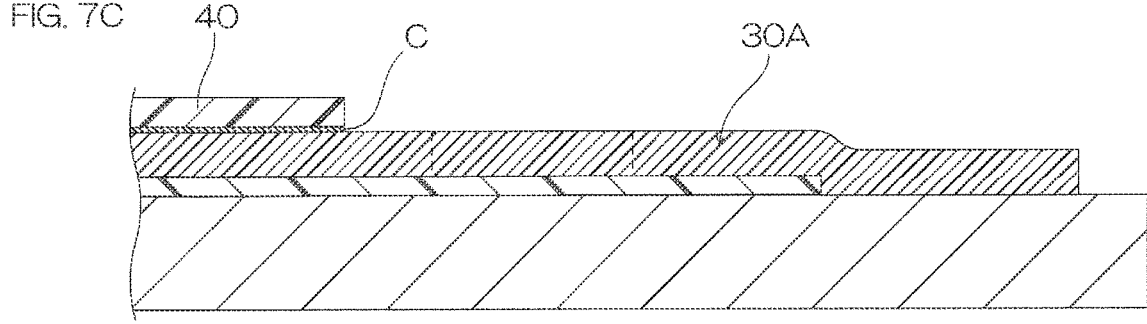

Next, a portion without being covered with the insulating layer 40 and exposed in the coated film C is removed as shown in FIG. 7C (electroless plating film removing step). The coated film C is, for example, partially removed by wet etching. Examples of the etching solution used for the wet etching include sulfuric acid hydrogen peroxide and nitric acid hydrogen peroxide.

Figure 8A:
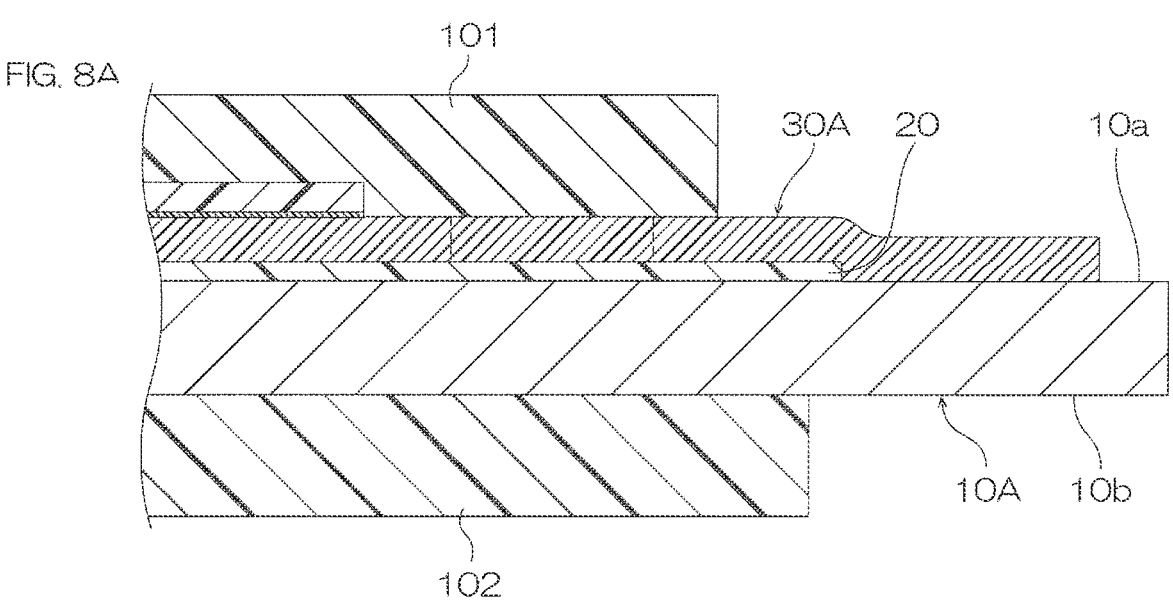
FIGS. 8A to 8C show steps subsequent to the steps shown in FIG. 7.
Figure 8R:
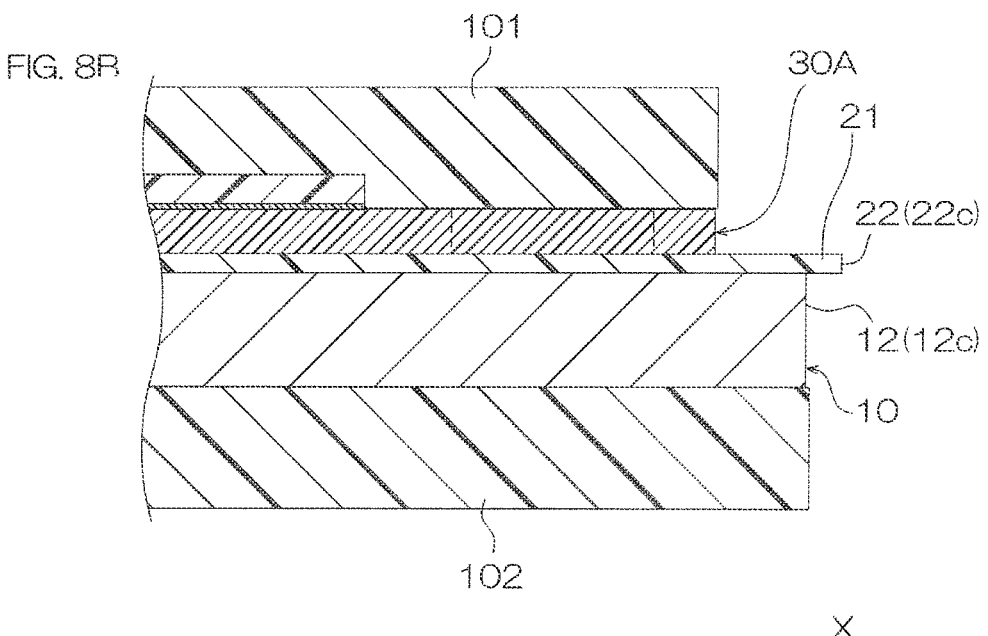
Figure 11:
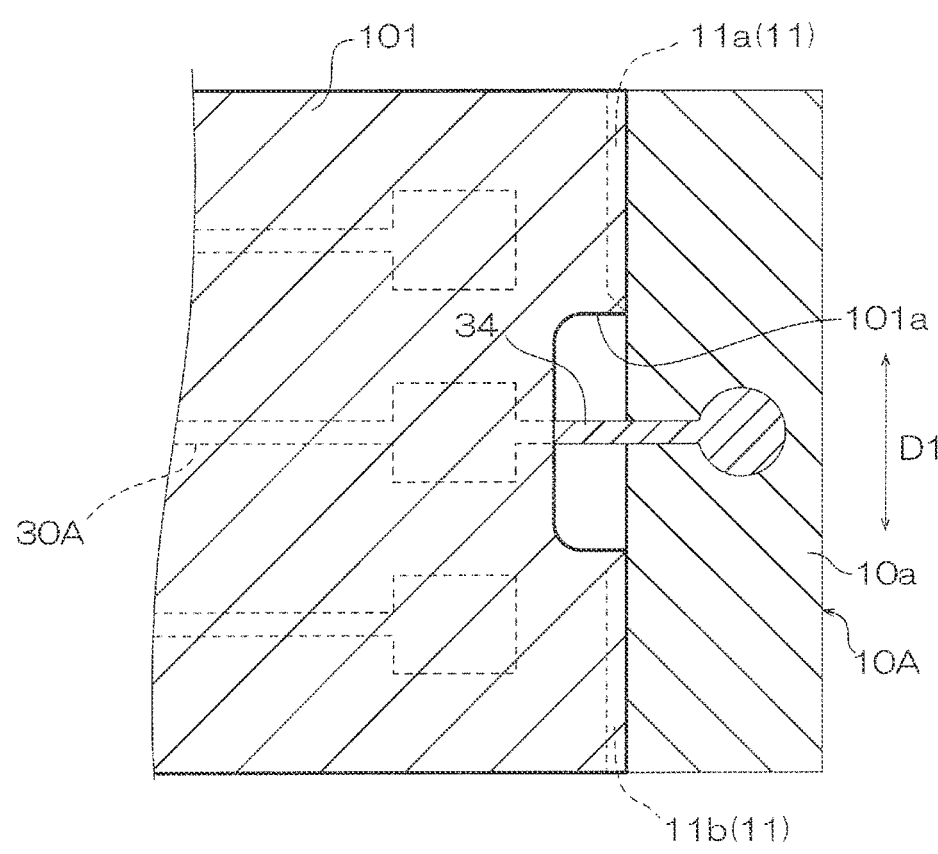
FIG. 11 shows a plan view including a first resist film formed in the resist film forming step shown in FIG. 8A.
Figure 12:
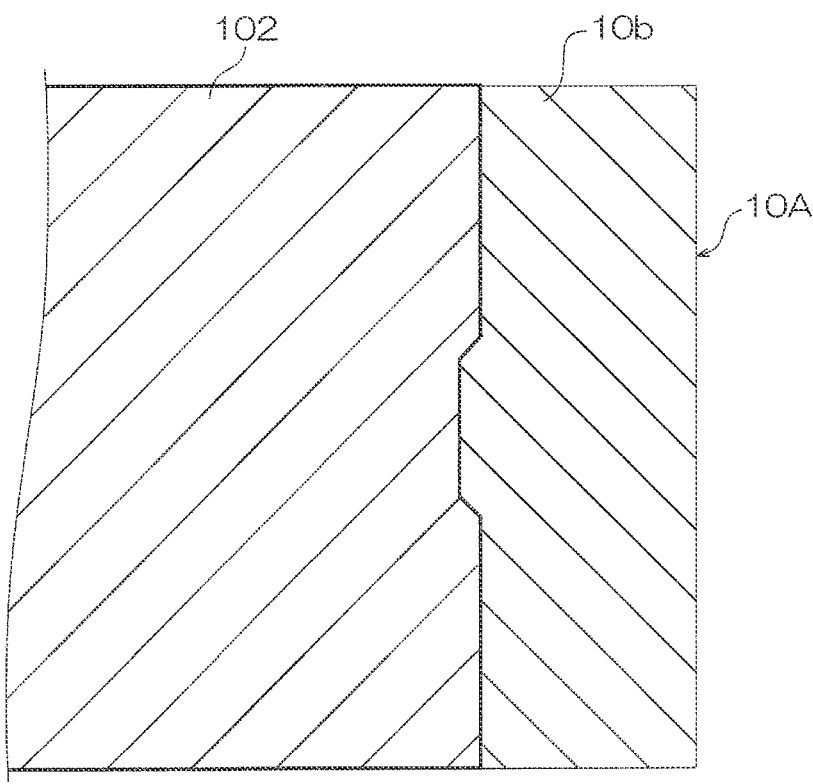
FIG. 12 shows a plan view including a second resist film formed in the resist film forming step shown in FIG. 8A.

Next, as shown in FIGS. 8A, 11, and 12, a first resist film 101 having a predetermined pattern is formed on the first surface 10a side of the metal substrate 10A, and a second resist film 102 having a predetermined pattern is formed on the second surface 10b side of the metal substrate 10A (resist film forming step). The first resist film 101 covers the conductive layer 30A on the insulating layer 20 except for a portion to be removed in an outer shape processing step to be described later in the conductive layer 30A (in FIG. 11, a portion covered with the first resist film 101 in the conductive layer 30A is shown by the broken line), and covers a portion to be formed into the above-described substrate extension portion 11 in the metal substrate 10A. The resist film 101 has a recessed portion 101a for exposing most of the lead wire 34 at a site corresponding to the lead wire 34.

Next, as shown in FIG. 8B, a site which is not covered with the first resist film 101 and the second resist film 102 in the metal substrate 10A and the conductive layer 30A is removed by wet etching (wet etching step). Specifically, the wet etching from both sides in the thickness direction is carried out using the first resist film 101 and the second resist film 102 as an etching mask. As the etching solution for the wet etching, for example, ferric chloride is used.

By the present step, the outer shape of the metal substrate 10A is processed, thereby forming the metal support substrate 10. Along with this, a part of the lead wire 34 (end portion connected to the terminal portion 31a) is left as the lead wire remaining part 34a, and another part of the lead wire 34 (all the formed lead wire 34) is removed and cut. Thus, the signal wiring 32 is electrically separated from the metal support substrate 10.

Figure 8C:
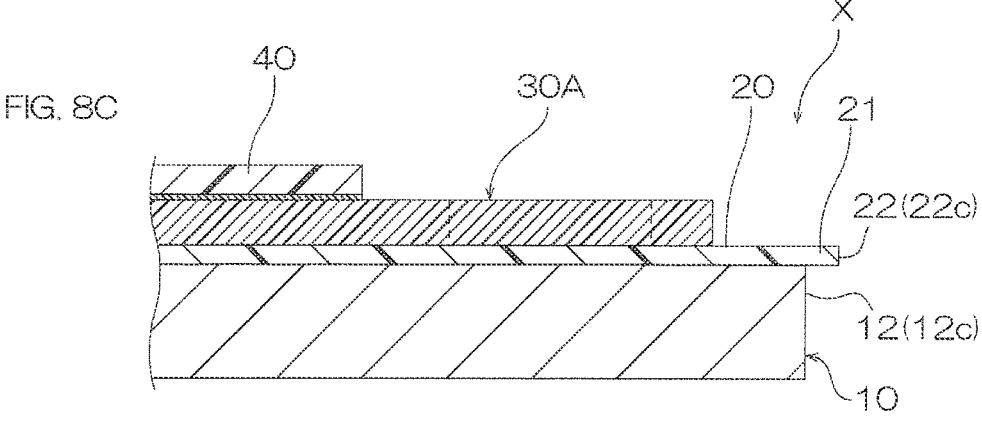

Next, as shown in FIG. 8C, the first resist film 101 and the second resist film 102 are removed by, for example, the etching (resist film removing step).

For example, by undergoing such steps as described above, it is possible to produce the wiring circuit board X.

In the wiring circuit board X, as described above, the edge portion E extending in the first direction D1 includes the partial structure portion E2 partially in the first direction D1, and in the partial structure portion E2, the insulating layer 20 has the insulating layer extension portion 22 extending outwardly with respect to the metal support substrate 10 in the second direction D2. The partial structure portion E2 is suitable for realizing electrical separation of the signal wiring 32 from the metal support substrate 10 in the production step of the wiring circuit board X as follows: temporarily forming the lead wire 34 which extends from the terminal portion 31 formed on the insulating layer 20, over the end portion of the insulating layer 20, and to the metal support substrate 10 (ref: FIG. 6C), using the lead wire

34 for the electroless plating process (ref: FIG. 7A), and thereafter, for example, partially removing the lead wire 34. That is, the wiring circuit board X including the partial structure portion E2 is suitable for avoiding a short circuit between the metal support substrate 10 and the signal wiring 32 in a final product, where the short circuit is due to temporary formation of the lead wire 34 extending from the terminal portion 31 over the end portion of the insulating layer 20 to reach the metal support substrate 10.

In the wiring circuit board, as described above, the edge portion E extending in the first direction D1 includes the main structure portion E1 in addition to the partial structure portion E2; and in the main structure portion E1, the metal support substrate 10 has the substrate extension portion 12 extending outwardly with respect to the insulating layer 20 in the second direction D2. Such a configuration is suitable for suppressing an occurrence of bending of the end portion of the insulating layer 20 in the edge portion E as compared with a configuration in which the insulating layer 20 extends outwardly with respect to the metal support substrate 10 over, for example, the entire region in the first direction of the edge portion E of the wiring circuit board. Suppression of the bending of the end portion of the insulating layer 20 in the edge portion E is preferable from the viewpoint of suppressing peeling of the insulating layer 20 from the metal support substrate 10 and from the viewpoint of ensuring an excellent shape in the edge portion E.

Figure 13:
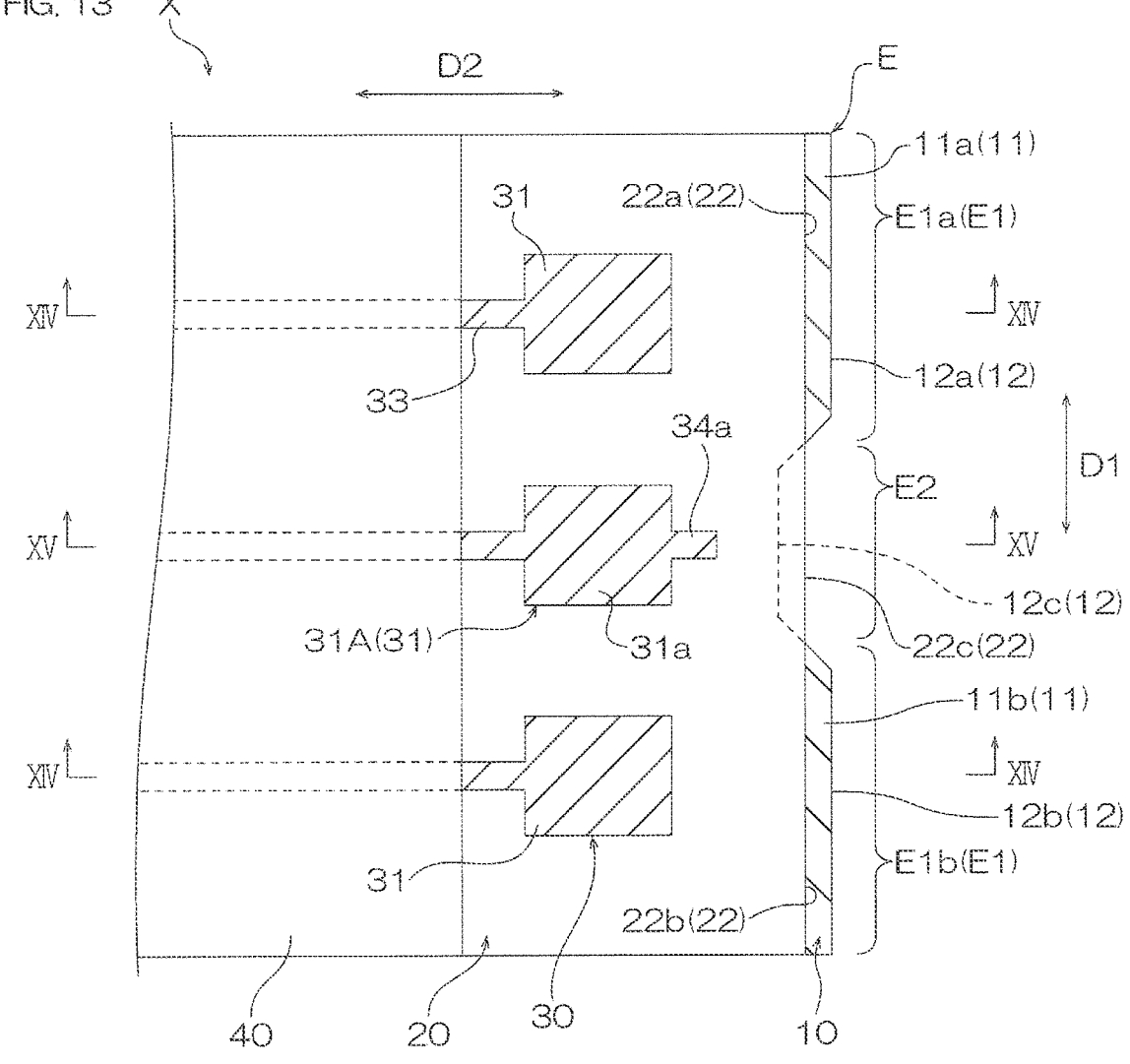
FIG. 13 shows a partially plan view of one modified example of the wiring circuit board shown in FIG. 1 in which an insulating layer of an edge portion of the wiring circuit board is flush along a first main structure portion, a partial structure portion, and a second main structure portion aligned in a first direction; and a metal support substrate extends outwardly with respect to the insulating layer in the first and second main structure portions and is retracted inwardly with respect to the insulating layer in the partial structure portion.
Figure 14:
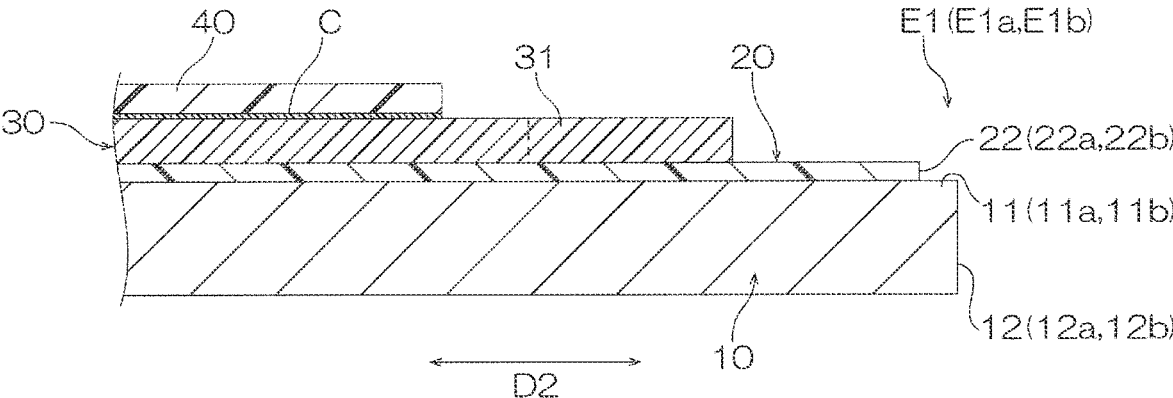
FIG. 14 shows a cross-sectional view along a XIV-XIV line shown in FIG. 13.
Figure 15:
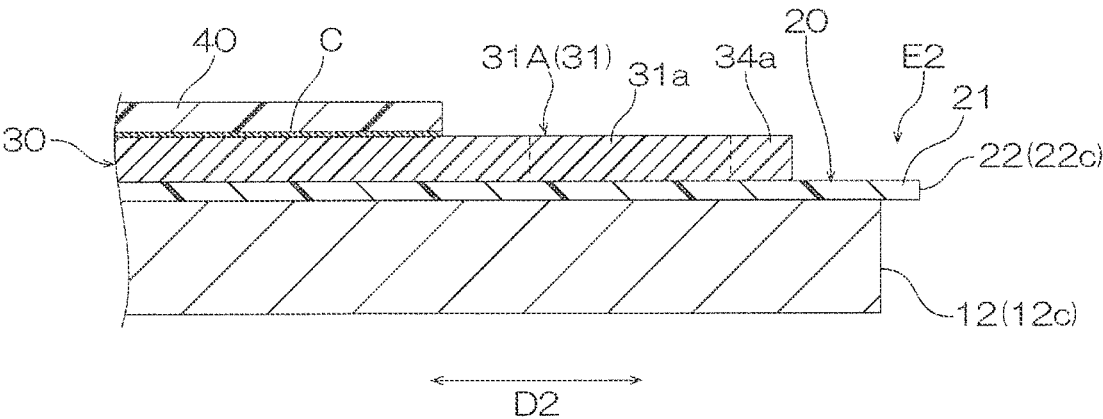
FIG. 15 shows a cross-sectional view along a XV-XV line shown in FIG. 13.

The edge portion E of the wiring circuit board X may have a configuration shown in FIGS. 13 to 15. The edge portion E shown in FIGS. 13 to 15 includes the main structure portion E1 including the first main structure portion E1a and the second main structure portion E1b, and the partial structure portion E2 located between the first and second main structure portions E1a and E1b. In the main structure portion E1 (the first main structure portion E1a and the second main structure portion E1b), as shown in FIG. 14, the metal support substrate 10 has the substrate extension portion 11 extending outwardly with respect to the insulating layer 20 in the second direction D2 (the substrate extension portion 11a in the first main structure portion E1a, and the substrate extension portion 11b in the second main structure portion E1b). In the partial structure portion E2, as shown in FIG. 15, the insulating layer 20 has the insulating layer extension portion 21 in which the insulating layer 20 extends outwardly with respect to the metal support substrate 10 in the second direction D2. The boundary structure portion E3 as described in the above-described embodiment is not included in the edge portion E of the present modified example.

In the present modified example, as shown in FIG. 13, the end surface 20a of the insulating layer 20 of the first main structure portion E1a, the end surface 20a of the insulating layer 20 of the second main structure portion E1b, and the end surface 20a of the insulating layer extension portion 21 of the partial structure portion E2 in the second direction D2 are flush along the first direction D1. In contrast, the metal support substrate 10 extends outwardly with respect to the insulating layer 20 in the first main structure portion E1a and the second main structure portion E1b, and is retracted inwardly with respect to the insulating layer 20 in the second direction D2 in the partial structure portion E2. Such a configuration can more easily reduce the area of the insulating layer 20 than the configuration of the edge portion E in the above-described embodiment.

Further, in such a configuration, in the first and second main structure portions E1a and E1b, the insulating layer 20 is in contact with the metal support substrate 10 to be directly supported, and both ends in the first direction D1 of the insulating layer extension portion 21 of the partial structure portion E2 are continuous with the insulating layer 20 of the main structure portions E1a and E1b. That is, both ends in the first direction D1 of the insulating layer extension portion 21 of the partial structure portion E2 are continuous in the first direction D1 with the insulating layer 20 which is in contact with the metal support substrate 10 to be directly supported, and are supported by the insulating layer 20. Therefore, the bending of the insulating layer extension portion 21 is suppressed.

Figure 16:
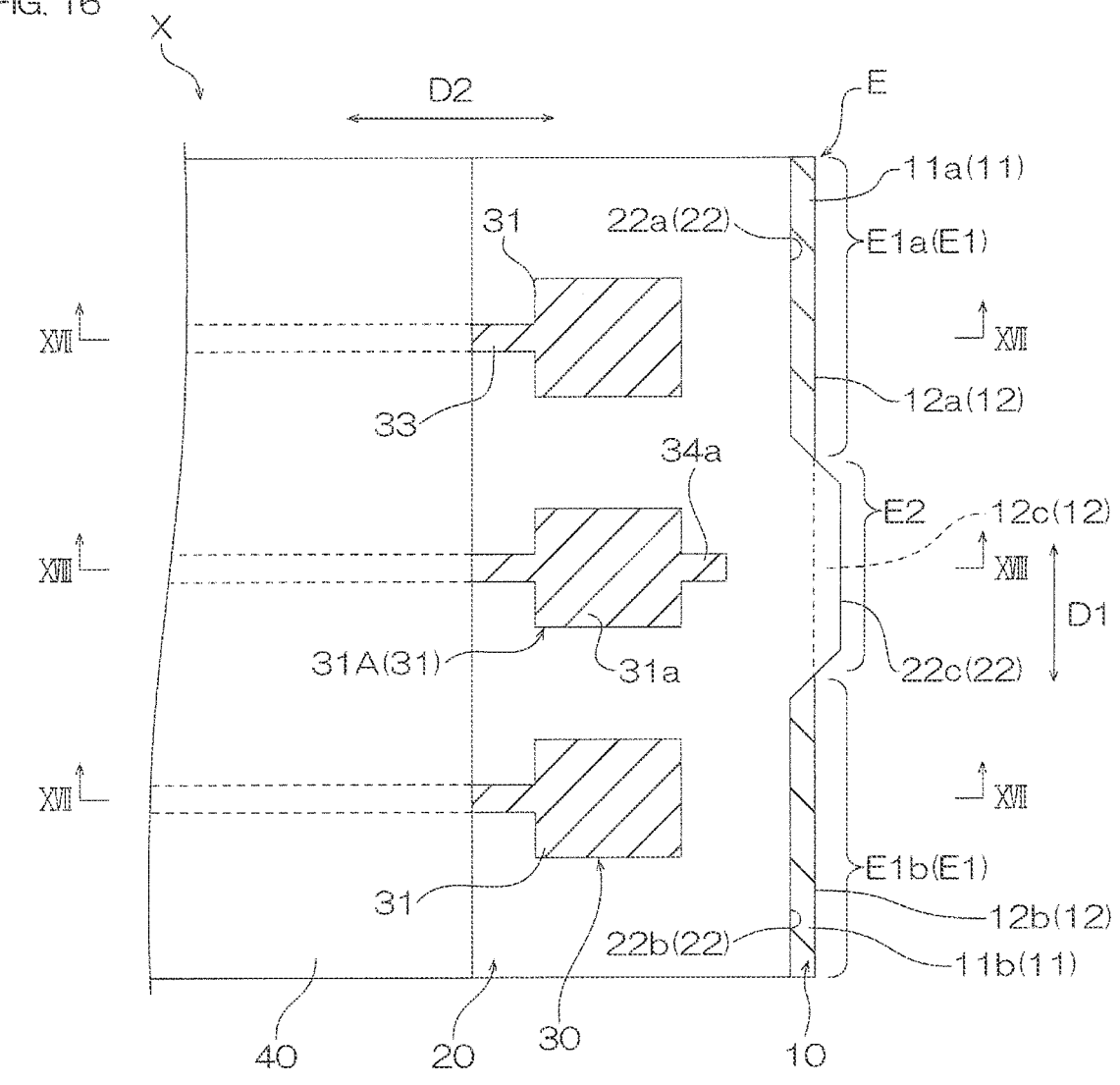
FIG. 16 shows a partially plan view of another modified example of the wiring circuit board shown in FIG. 1 in which a metal support substrate of an edge portion of the wiring circuit board is flush along a first main structure portion, a partial structure portion, and a second main structure portion aligned in a first direction; and an insulating layer is retracted inwardly with respect to the metal support substrate in the first and second main structure portions and extends outwardly with respect to the metal support substrate in the partial structure portion.
Figure 17:
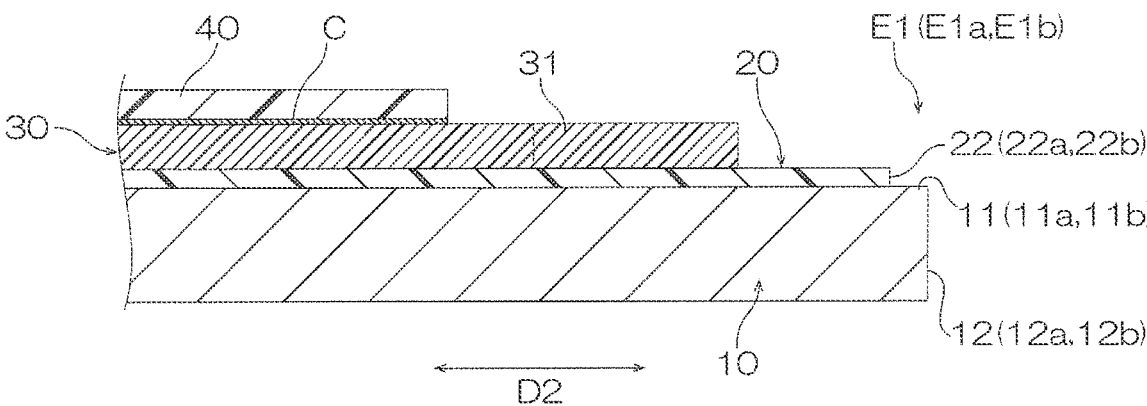
FIG. 17 shows a cross-sectional view along a XVII-XVII line shown in FIG. 16.
Figure 18:
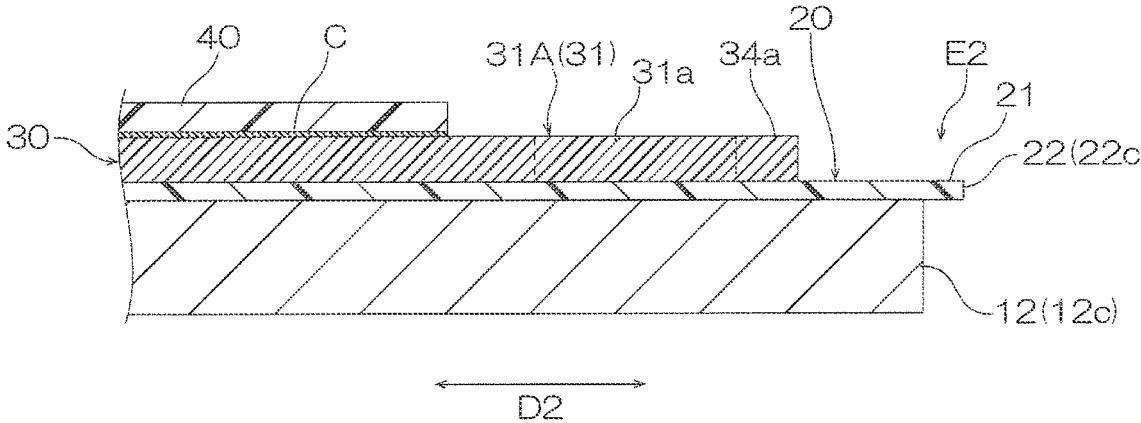
FIG. 18 shows a cross-sectional view along a XVIII-XVIII line shown in FIG. 16.

The edge portion E of the wiring circuit board X may have a configuration shown in FIGS. 16 to 18. The edge portion E shown in FIGS. 16 to 18 includes the main structure portion E1 including the first main structure portion E1a and the second main structure portion E1b, and the partial structure portion E2 located between the first and second main structure portions E1a and E1b. In the main structure portion E1 (the first main structure portion E1a and the second main structure portion E1b), as shown in FIG. 17, the metal support substrate 10 has the substrate extension portion 11 extending outwardly with respect to the insulating layer 20 in the second direction D2 (the substrate extension portion 11a in the first main structure portion E1a, and the substrate extension portion 11b in the second main structure portion E1b). In the partial structure portion E2, as shown in FIG. 18, the insulating layer 20 has the insulating layer extension portion 21 extending outwardly with respect to the metal support substrate 10 in the second direction D2. The boundary structure portion E3 as described in the above-described embodiment is not included in the edge portion E of the present modified example.

In the present modified example, the end surface 10a of the substrate extension portion 11 of the first main structure portion E1a, the end surface 10a of the substrate extension portion 11 of the second main structure portion E1b, and the end surface 10a of the metal support substrate 10 of the partial structure portion E2 in the second direction D2 are flush along the first direction D1. In contrast, the insulating layer 20 is retracted inwardly with respect to the metal support substrate 10 in the first main structure portion E1a and the second main structure portion E1b, and extends outwardly with respect to the metal support substrate 10 in the partial structure portion E2 in the second direction D2. Such a configuration can more easily reduce the area of the metal support substrate 10 than the configuration of the edge portion E in the above-described embodiment.

Such a configuration is suitable for suppressing the occurrence of the bending of the end portion of the insulating layer 20 in the edge portion E as compared with a configuration in which the insulating layer 20 extends outwardly with respect to the metal support substrate 10 over, for example, the entire region in the first direction D1 of the edge portion E in the wiring circuit board.

INDUSTRIAL APPLICATION

The wiring circuit board of the present invention can be, for example, used for a suspension board with a circuit which is assembled into a hard disk drive or the like.

DESCRIPTION OF REFERENCE NUMERALS

X Wiring circuit board
D1 First direction
D2 Second direction
E Edge portion

E1 Main structure portion
E1a First main structure portion
E1b Second main structure portion
E2 Partial structure portion
E3 Boundary structure portion
E3a First boundary structure portion
E3b Second boundary structure portion
10 Metal support substrate
11 Substrate extension portion
12 End surface
20, 40 Insulating layer
21 Insulating layer extension portion
22 End surface
30 Conductive layer
31 Terminal portion
31a Lead wire remaining part-including terminal portion
32 Wiring
33 Ground wiring
34 Lead wire
34a Lead wire remaining part
C Coated film

The invention claimed is:

1. A wiring circuit board comprising:
a metal support substrate, an insulating layer, and a conductive layer in this order in a thickness direction,
wherein the wiring circuit board has an edge portion extending in a first direction,
wherein the edge portion includes a main structure portion in which the metal support substrate has a substrate extension portion extending outwardly with respect to the insulating layer in a second direction perpendicular to the first direction and the thickness direction, and partially includes a partial structure portion in which the insulating layer has an insulating layer extension portion extending outwardly with respect to the metal support substrate in the second direction, and
wherein the conductive layer includes:
a lead wire remaining part-including terminal portion; and
a wiring connected to the lead wire remaining part-including terminal portion, and wherein the lead wire remaining part-including terminal portion includes:
a terminal portion connected to the wiring; and
a lead wire remaining part which is disposed at an opposite side to the wire with respect to the terminal portion in the second direction, and disposed between the terminal portion and the insulating layer extension portion, and protrudes from the terminal portion toward the insulating layer extension portion.

2. The wiring circuit board according to claim 1, wherein the conductive layer includes a plurality of terminal portions aligned spaced apart from each other in the first direction, and the plurality of terminal portions include the lead wire remaining part-including terminal portion.

3. The wiring circuit board according to claim 1, wherein the main structure portion includes a first main structure portion and a second main structure portion apart in the first direction, and
wherein, in the edge portion, the partial structure portion is located between the first main structure portion and the second main structure portion.

4. A wiring circuit board comprising:
a metal support substrate, an insulating layer, and a conductive layer in this order in a thickness direction,
wherein the wiring circuit board has an edge portion extending in a first direction,

wherein the edge portion includes a main structure portion in which the metal support substrate has a substrate extension portion extending outwardly with respect to the insulating layer in a second direction perpendicular to the first direction and the thickness direction, and partially includes a partial structure portion in which the insulating layer has an insulating layer extension portion extending outwardly with respect to the metal support substrate in the second direction, wherein the main structure portion includes a first main structure portion and a second main structure portion apart in the first direction, wherein, in the edge portion, the partial structure portion is located between the first main structure portion and the second main structure portion, wherein the edge portion includes a first boundary structure portion in which an end surface of the metal support substrate and an end surface of the insulating layer in the second direction are flush along the thickness direction, between the first main structure portion and the partial structure portion; and includes a second boundary structure portion in which the end surface of the metal support substrate and the end surface of the insulating layer in the second direction are flush along the thickness direction, between the second main structure portion and the partial structure portion, and wherein each end surface of the substrate extension portions of the first and second main structure portions, each end surface of the metal support substrate and the insulating layer of the first and second boundary structure portions, and an end surface of the insulating layer of the partial structure portion in the second direction are flush along the first direction.

5. A wiring circuit board comprising:

a metal support substrate, an insulating layer, and a conductive layer in this order in a thickness direction, wherein the wiring circuit board has an edge portion extending in a first direction, wherein the edge portion includes a main structure portion in which the metal support substrate has a substrate extension portion extending outwardly with respect to the insulating layer in a second direction perpendicular to the first direction and the thickness direction, and partially includes a partial structure portion in which the insulating layer has an insulating layer extension portion extending outwardly with respect to the metal support substrate in the second direction, wherein the main structure portion includes a first main structure portion and a second main structure portion apart in the first direction, wherein, in the edge portion, the partial structure portion is located between the first main structure portion and the second main structure portion, and wherein each end surface of the insulating layers of the first and second main structure portions and an end surface of the insulating layer extension portion of the partial structure portion in the second direction are flush along the first direction.

6. A wiring circuit board comprising:

a metal support substrate, an insulating layer, and a conductive layer in this order in a thickness direction, wherein the wiring circuit board has an edge portion extending in a first direction, wherein the edge portion includes a main structure portion in which the metal support substrate has a substrate extension portion extending outwardly with respect to the insulating layer in a second direction perpendicular to the first direction and the thickness direction, and partially includes a partial structure portion in which the insulating layer has an insulating layer extension portion extending outwardly with respect to the metal support substrate in the second direction, wherein the main structure portion includes a first main structure portion and a second main structure portion apart in the first direction, wherein, in the edge portion, the partial structure portion is located between the first main structure portion and the second main structure portion, and wherein each end surface of the substrate extension portions of the first and second main structure portions and an end surface of the metal support substrate of the partial structure portion in the second direction are flush along the first direction.

* * * * *